United States Patent
Takase et al.

(10) Patent No.: US 7,618,573 B2
(45) Date of Patent: Nov. 17, 2009

(54) RESIN SEALING METHOD FOR ELECTRONIC PART AND MOLD USED FOR THE METHOD

(75) Inventors: Shinji Takase, Kyoto (JP); Takashi Tamura, Kyoto (JP); Yohei Onishi, Kyoto (JP)

(73) Assignee: Towa Corporation, Kyoto-shi, Kyoto (JP)

( * ) Notice: Subject to any disclaimer, the term of this patent is extended or adjusted under 35 U.S.C. 154(b) by 590 days.

(21) Appl. No.: 10/562,356

(22) PCT Filed: Dec. 22, 2004

(86) PCT No.: PCT/JP2004/019164

§ 371 (c)(1),
(2), (4) Date: Dec. 27, 2005

(87) PCT Pub. No.: WO2005/077633

PCT Pub. Date: Aug. 25, 2005

(65) Prior Publication Data

US 2006/0186576 A1    Aug. 24, 2006

(30) Foreign Application Priority Data

Feb. 13, 2004 (JP) ............................. 2004-037179

(51) Int. Cl.
B29C 43/18 (2006.01)
B29C 70/78 (2006.01)
B29C 70/72 (2006.01)

(52) U.S. Cl. ............................ 264/272.15; 264/272.17; 264/275

(58) Field of Classification Search ....................... None
See application file for complete search history.

(56) References Cited

U.S. PATENT DOCUMENTS

| | | | | |
|---|---|---|---|---|
| 4,618,466 | A * | 10/1986 | McGlashen et al. | 264/40.6 |
| 6,080,354 | A * | 6/2000 | Miyajima | 264/511 |
| 6,258,314 | B1 | 7/2001 | Oida et al. | |
| 6,261,501 | B1 | 7/2001 | Miyagawa et al. | |
| 6,306,331 | B1 * | 10/2001 | Lajza et al. | 264/272.13 |
| 6,346,433 | B1 | 2/2002 | Maeda et al. | |
| 6,459,159 | B1 | 10/2002 | Miyagawa et al. | |
| 6,652,799 | B2 * | 11/2003 | Seng et al. | 264/511 |
| 2001/0013424 | A1 | 8/2001 | Takase et al. | |
| 2007/0138696 | A1 * | 6/2007 | Takase et al. | 264/272.17 |

FOREIGN PATENT DOCUMENTS

| | | | |
|---|---|---|---|
| JP | 11-019938 A | | 1/1999 |
| JP | 2000-280298 A | | 10/2000 |
| JP | 2002-43345 A | | 2/2002 |
| JP | 2004098364 | * | 4/2004 |

(Continued)

*Primary Examiner*—Edmund H. Lee
(74) *Attorney, Agent, or Firm*—Birch, Stewart, Kolasch & Birch, LLP

(57) ABSTRACT

An upper mold, a lower mold, a middle mold, and a release film are used in a method of resin sealing of an electronic component. The release film is sandwiched between the lower mold and the middle mold and held under a prescribed tension to cover a cavity of the lower mold. A cavity side surface is also covered with the release film. Therefore, releasability of a cured resin from the cavity side surface is increased. As a result, the cured resin is prevented from being damaged near the cavity side surface.

1 Claim, 13 Drawing Sheets

FOREIGN PATENT DOCUMENTS

| | | |
|---|---|---|
| KR | 10-0335675 B1 | 8/1999 |
| KR | 2000-0011536 A | 2/2000 |
| KR | 10-0419356 B1 | 9/2001 |
| KR | 10-0357362 B1 | 10/2002 |

* cited by examiner

RESIN SEALING METHOD FOR ELECTRONIC PART AND MOLD USED FOR THE METHOD

TECHNICAL FIELD

The present invention relates to a method of resin sealing of a substrate having an electronic component mounted thereon, and to a mold used in the method.

BACKGROUND ART

A mold having a two-mold structure consisting of an upper mold and a lower mold as disclosed in a patent document 1 described below, for example, has been conventionally used as a mold for transferless molding. In a method of resin sealing of an electronic component using the mold of the two-mold structure, a problem must be avoided which is caused by failure of separation of a molded resin from the mold at mold opening. Therefore, a resin is molded with a release film interposed between a melting resin and the mold. In this situation, the release film is attracted through a plurality of holes provided in the mold. With this suction, the release film adheres to a surface of the mold. Therefore, the release film is prevented from moving apart from the surface of the mold and contacting the electronic component. As a result, damaging of the electronic component is prevented.

On the other hand, another method of resin sealing of an electronic component has also been conventionally used, in which method a mold is set to a vacuum state to introduce a resin into a space inside the mold. In this method, the mold is in a clamped state and air inside the mold is evacuated by a suction device. Molding of the resin is performed well with this method because the resin is introduced evenly inside the mold. Therefore, it is desirable to use both of the method using the release film and the method of molding the resin with the mold set to the vacuum state.

When the mold is set to the vacuum state, however, a force of attraction drawing the release film to inside of the mold sometimes becomes larger than a force of attraction of the suction device drawing the release film toward the surface of the mold. A problem of the release film contacting the electronic component inside the mold occurs in this situation. Therefore, when the mold of the two-mold structure is used, it is difficult to use both of the method of resin sealing using the release film and the method of resin sealing in which the resin is introduced into the mold by setting the mold to the vacuum state.

Patent Document 1: Japanese Patent Laying-Open No. 2002-043345 (See Page 15 and FIG. 13)

DISCLOSURE OF THE INVENTION

Problems to be Solved by the Invention

The inventor of the present application has invented a mold having a three-mold structure for using both of a method of using a release film and a method of setting a mold in a vacuum state.

The mold of the three-mold structure has a middle mold besides an upper mold and a lower mold. The middle mold is inserted between the upper mold and the lower mold and is used to press the release film against the lower mold during resin molding. Therefore, the release film is prevented from moving apart from the lower mold and contacting an electronic component even when a resin is molded with the mold in a vacuum state.

Releasability of the resin from an internal side surface of a cavity is low, however, since the internal side surface of the cavity directly contacts the resin without interposition of the release film. Therefore, a cured resin is cracked near the internal side surface of the cavity at mold opening because the cured resin is not separated from an internal side surface of the middle mold.

The present invention is made in view of the above-described problem. An object of the present invention is to prevent cracking of a cured resin near an internal side surface of a cavity at mold opening in a method of resin sealing of an electronic component, in which method a resin is molded while a release film is pressed by a middle mold of a mold of a three-mold structure against a surface of a lower mold and while the mold is set to a vacuum state.

Means for Solving the Problems

A method of resin sealing of an electronic component according to the present invention is a method of resin sealing of an electronic component in a cavity using an upper mold, a lower mold opposite to the upper mold, a middle mold provided between the upper mold and the lower mold, and a release film covering the cavity of the lower mold.

In the method, first an unsealed substrate having the electronic component mounted thereon is attached to the upper mold. Then, a whole surface of the cavity is covered with the release film while the release film is sandwiched between the lower and middle molds. Thereafter, the upper mold and the lower and middle molds are clamped to immerse the electronic component in a melting resin in the cavity. The melting resin is then cured to form a cured resin. Then, the upper, lower and middle molds are opened. A sealed substrate having the electronic component enveloped in the cured resin is removed from the upper mold.

According to this method, the resin is molded with the cavity having not only a bottom surface but also a side surface covered with the release film. With this, releasability of the cured resin from the side surface of the cavity is increased. Therefore, the cured resin is prevented from being damaged near the side surface of the cavity when the sealed substrate is removed from the cavity. A mold according to the present invention is used in the method of resin sealing of an electronic component described above.

The foregoing and other objects, features, aspects and advantages of the present invention will become more apparent from the following detailed description of the present invention when taken in conjunction with the accompanying drawings.

DESCRIPTION OF THE REFERENCE SIGNS

1: substrate, 2: semiconductor chip, 4: unsealed substrate, 5: resin material, 6: melting resin, 7, 59: sealing and molding portion, 10, 62: cured resin, 11: sealed substrate, 13: upper mold, 14: lower mold, 15: middle mold, 16: cavity, 17, 57: release film.

BEST MODES FOR CARRYING OUT THE INVENTION

First Embodiment

A method of resin sealing according to a first embodiment and a mold used in the method will now be described referring to FIGS. 1-11.

Figure 1:
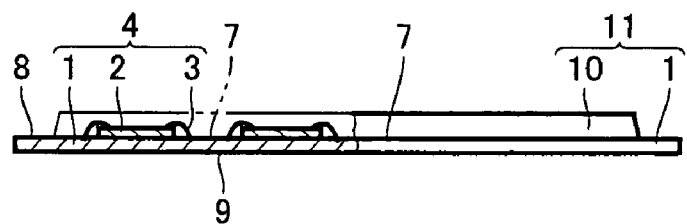
FIG. 1 shows a substrate having a semiconductor chip for resin sealing mounted thereon according to a first embodiment. The substrate before resin sealing is shown on a left side and the substrate after resin sealing is shown on a right side.

A substrate 1 to be resin-sealed using the method of resin sealing according to this embodiment is described using FIG. 1. Substrate 1 has a circular or polygonal shape. A plurality of semiconductor chips 2 (hereafter referred to as "chip 2") are mounted on one surface of substrate 1. Substrate 1 and chip 2 are electrically connected to each other with a wire 3.

One side of a sealed substrate 11 has a sealing and molding portion 7 on which a resin enveloping chip 2 is molded and a substrate rim portion 8 which is a portion around sealing and molding portion 7 on which the resin is not molded. The other surface of substrate 1 on a backside of sealing and molding portion 7 is a non-mounting surface 9 on which chip 2 is not mounted. A cured resin 10 is formed on sealing and molding portion 7 after the resin sealing. Examples of substrate 1 include a BGA (Ball Grid Array) substrate and a CSP (Chip Size Package) substrate.

Figure 2:
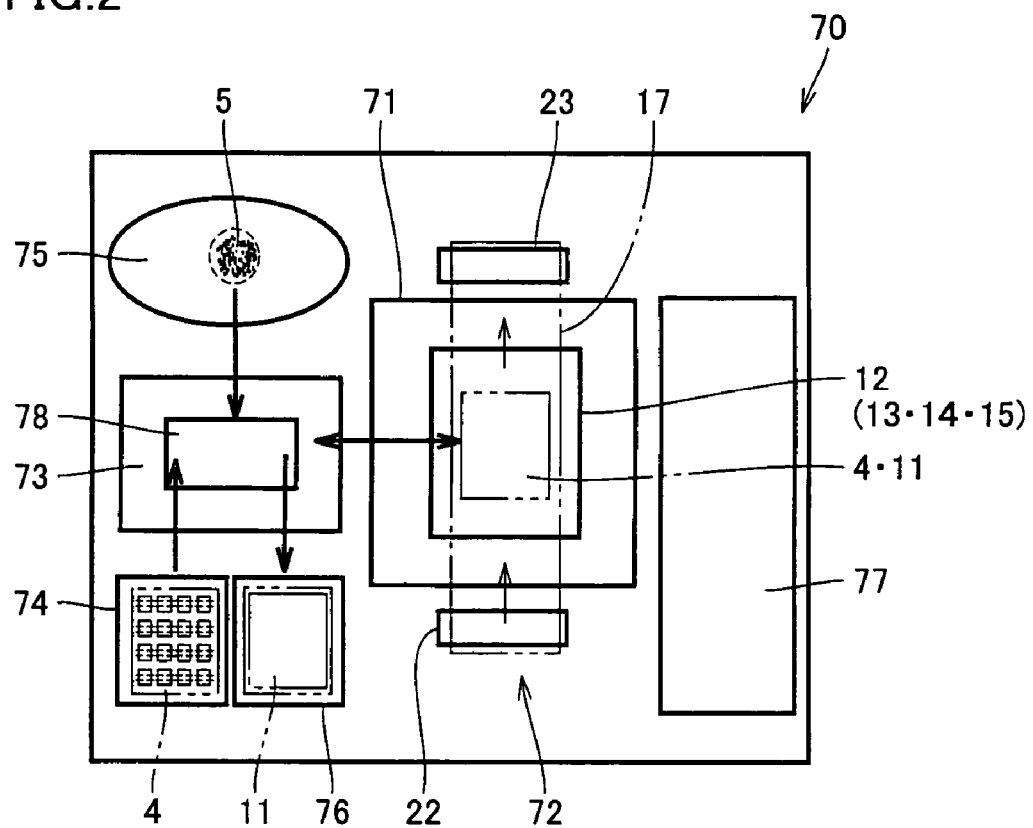
FIG. 2 is a plan view of a layout of a resin sealing apparatus.

A resin sealing apparatus of this embodiment is described using FIG. 2. A resin sealing apparatus 70 of this embodiment has a mold 12. Mold 12 is a mold for transferless molding having a three-mold structure. The three-mold structure consists of an upper mold 13, a lower mold 14 and a middle mold 15. Mold 12 is mounted on a press unit 71.

Resin sealing apparatus 70 includes a loader unit 73 having a function of supplying an unsealed substrate 4 and a resin material 5 into mold 12 and a function of removing sealed substrate 11 from mold 12. Unsealed substrate 4 is stored in an in-magazine unit 74 before it is transported to loader unit 73. Resin material 5 is stored in a resin material unit 75 before it is transported to loader unit 73. Sealed substrate 11 is removed from press unit 71 by loader unit 73 and stored in an out-magazine unit 76.

In addition, each of in-magazine unit 74 and out-magazine unit 76 is provided with a magazine cassette of a slit type on which a plurality of substrates 1 (unsealed substrate 4 or sealed substrate 11) are mounted spaced apart from each other. In a process of resin sealing of the first embodiment, substrate 1 is stored in the magazine cassette with its sealing and molding portion 7 facing downward.

Press unit 71 clamps and opens mold 12. Lower mold 14 is moved upward and downward by press means such as a mechanism utilizing a pressure of a working fluid or an electric press mechanism. Middle mold 15 is moved upward and downward by press means other than the press means of lower mold 14.

In addition, a feed portion 22 for feeding a release film 17 and a take-up portion 23 for taking up release film 17 are provided near mold 12. Release film 17 moves from feed portion 22 to take-up portion 23 in a direction of an arrow shown in FIG. 2. Feed portion 22 and take-up portion 23 can also increase or decrease a tension of release film 17.

Loader unit 73 includes transfer means 78 such as a mechanical chuck transfer mechanism or a robot arm transfer mechanism. Therefore, unsealed substrate 4 and resin material 5 are transferred by transfer means 78 and move inside mold 12 in a substantially horizontal direction. An upper portion of transfer means 78 is used for supplying unsealed substrate 4 and removing sealed substrate 11, and a lower portion of transfer means 78 is used for supplying resin material 5.

Resin material unit 75 includes a storage portion (not shown) such as a resin storage locker for storing a granular resin material 5 for use. A control unit 77 for controlling each of aforementioned units 71-76 and a vacuum unit is also provided.

An outline of the method of resin sealing of an electronic component of this embodiment will now be described.

First, unsealed substrate 4 is transported from in-magazine unit 74 to an upper portion of loader unit 73. Then, resin material 5 is transported from resin material unit 75 to a lower portion of loader unit 73. Thereafter, unsealed substrate 4 and resin material 5 are transported from loader unit 73 to press unit 71. Then, resin sealing of unsealed substrate 4 is performed in mold 12 and thereby sealed substrate 11 is obtained.

Then, sealed substrate 11 is removed from mold 12 and mounted on the upper portion of loader unit 73. Thereafter, sealed substrate 11 is transported from loader unit 73 to out-magazine unit 76.

Figure 3:
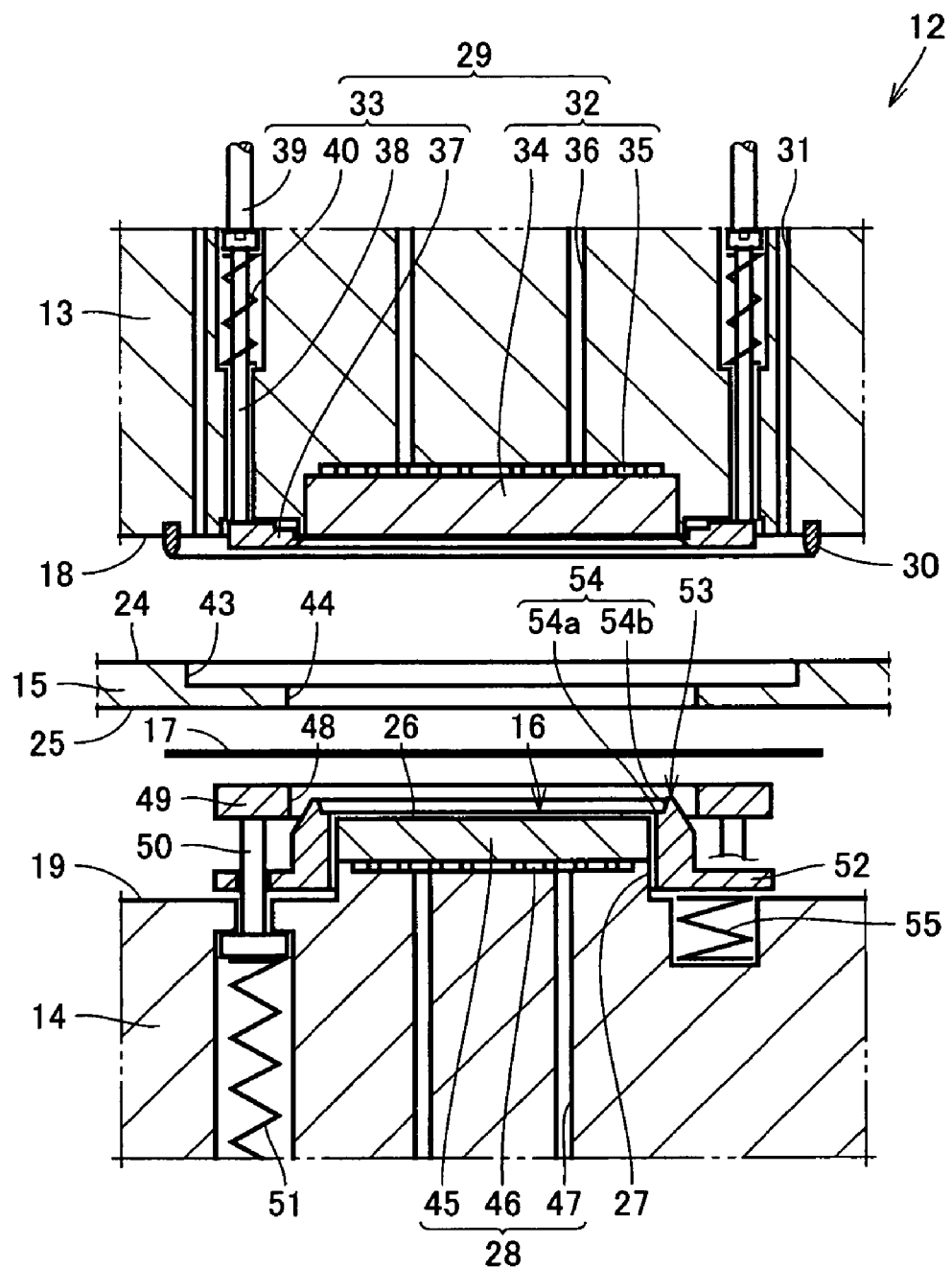
FIG. 3 is a cross-sectional view of a mold according to the embodiment, in which upper, lower and middle molds are opened.

The mold of this embodiment is described using FIG. 3.

As shown in FIG. 3, mold 12 of this embodiment includes upper mold 13, lower mold 14 and middle mold 15. Upper mold 13 does not move. Therefore, a position of an upper mold surface 18 of upper mold 13 is fixed. Lower mold 14 moves upward and downward. Lower mold 14 includes a lower mold surface 19 and a convex portion 27 projected from lower mold surface 19. Convex portion 27 has a cavity surface 26. Middle mold 15 is located between upper mold 13 and lower mold 14, and is moved upward and downward. Middle mold 15 includes an upper mold-side mold surface 24 and a lower mold-side mold surface 25. As shown in FIG. 3, middle mold 15 also includes a housing portion 43 for housing a chuck member 37 holding substrate 1 and a through hole 44 into which lower mold 14 is inserted.

Upper mold 13 also includes a substrate mechanism 29, a seal member 30 and a suction and exhaust hole 31. Substrate mechanism 29 fixes unsealed substrate 4 on upper mold surface 18 with chip 2 facing downward. Seal member 30 fills a clearance between upper mold 13 and middle mold 15 when upper mold 13, lower mold 14 and middle mold 15 are clamped. Suction and exhaust hole 31 communicates with a vacuum mechanism for setting a space inside the mold to a vacuum state when upper mold 13, lower mold 14 and middle mold 15 are clamped.

In addition, as shown in FIG. 3, substrate mechanism 29 in upper mold 13 includes a suction portion 32 for adhering to substrate 1 (unsealed substrate 4 and sealed substrate 11) by suction and a holder portion 33 for holding substrate 1.

Suction portion 32 of upper mold 13 adheres to substrate 1 by suction. Suction portion 32 includes a permeable member 34, a communication groove 35 and a suction and exhaust hole 36. Permeable member 34 adheres to non-mounting surface 9 of substrate 1 by suction. Communication groove 35 communicates with permeable member 34. Suction and exhaust hole 36 communicates with communication groove 35 and is connected to the vacuum mechanism (not shown). The vacuum mechanism attracts non-mounting surface 9 of substrate 1 via permeable member 34, communication groove 35 and suction and exhaust hole 36.

Holder portion 33 is provided between suction portion 32 and seal member 30. Substrate rim portion 8 of substrate 1 is mounted on holder portion 33. Holder portion 33 has chuck member 37 having an opening corresponding to chip 2, an attached rod 38 attached to chuck member 37, a resilient member 40 into which attached rod 38 is inserted, and a driving member 39 for driving attached rod 38.

On the other hand, a film mechanism 28 is provided in lower mold 14. Film mechanism 28 includes a permeable member 45, a communication groove 46 communicating with permeable member 45 and a suction and exhaust hole 47 communicating with communication groove 46. Suction and exhaust hole 47 communicates with a vacuum unit (not shown) for attracting release film 17. The vacuum unit attracts release film 17 toward cavity surface 26 via suction and exhaust hole 47, communication groove 46 and permeable member 45. With this, release film 17 is tightly adhered to cavity surface 26. Therefore, release film 17 covering a whole surface of cavity 16 is prevented from moving inside a cavity space 20.

In addition, film mechanism 28 discharges air from cavity surface 26 via suction and exhaust hole 47, communication groove 46 and permeable member 45. With this, sealed substrate 11 is readily removed from cavity surface 26.

An operation during clamping of mold 12 and a detailed structure of mold 12 will now be described using FIGS. 4-11.

Figure 4:
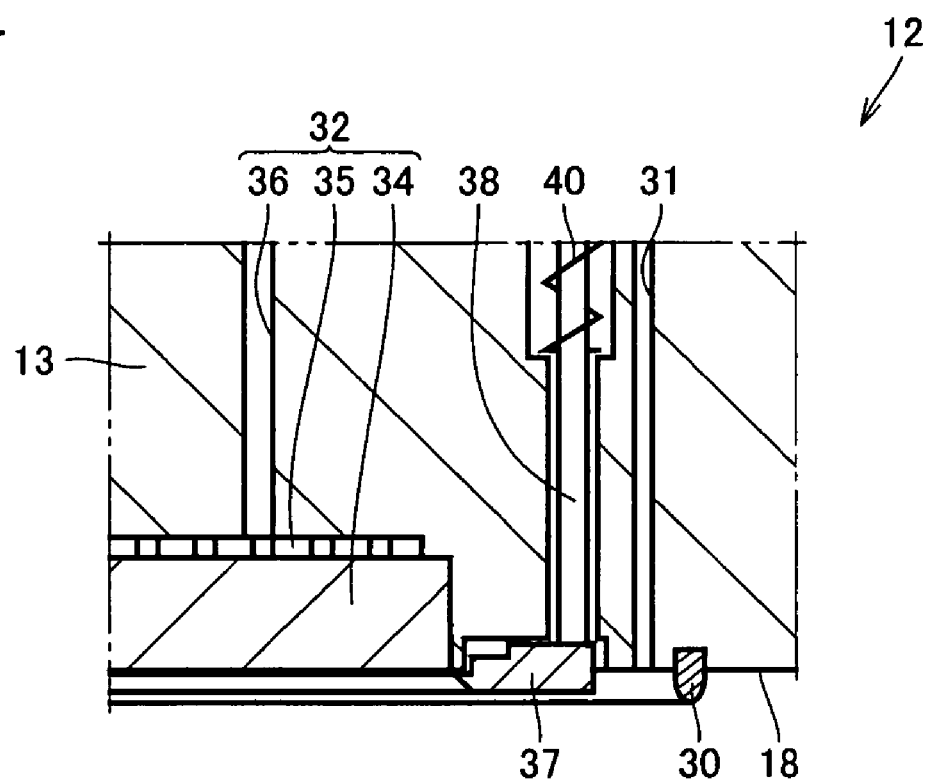
FIG. 4 is an enlarged cross-sectional view of a main portion of the mold shown in FIG. 3, in which a release film is sandwiched between the lower and middle molds.
Figure 4:
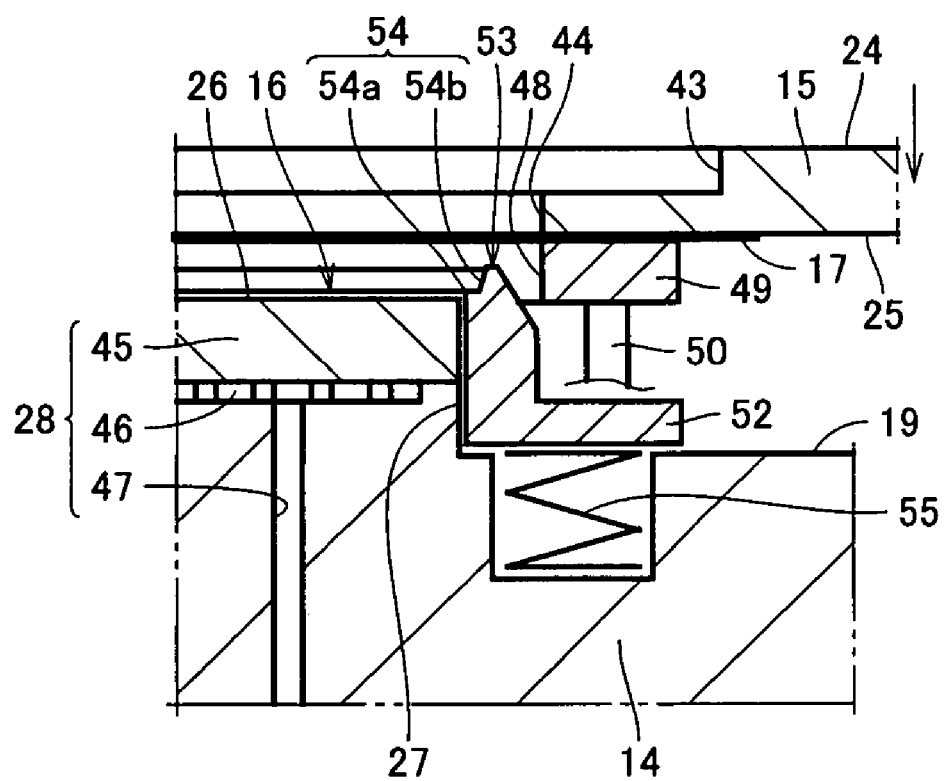

At mold clamping, first, middle mold 15 moves downward. With this, lower mold-side mold surface 25 comes into contact with release film 17. Thereafter, middle mold 15 further moves downward. With this, release film 17 is sandwiched between lower mold-side mold surface 25 and an upper surface of a sandwiching member 49, as shown in FIG. 4. An attached rod 50 for supporting sandwiching member 49 is provided on a lower surface of sandwiching member 49. In addition, a resilient member 55 for resiliently supporting a cavity member 52 is provided on a lower side of cavity member 52.

In a state of mold opening as shown in FIG. 3, the upper surface of sandwiching member 49 is in a higher position than lower mold 14 and resilient member 55 is in an expanding state. When lower mold 14 and middle mold 15 are clamped, on the other hand, resilient member 55 is set to a contracting state as shown in FIG. 4 by sandwiching member 49 and attached rod 50 moving downward.

Next, as middle mold 15 further moves downward with release film 17 sandwiched between middle mold 15 and sandwiching member 49, a portion of release film 17 in a space formed with through hole 44 and an opening portion 48 abuts on cavity member 52.

Since cavity member 52 is provided to surround convex portion 27, it can move upward and downward between lower mold 14 and middle mold 15. Cavity member 52 has a cross section of an L shape. The L shape is formed with a vertical portion and a horizontal portion.

Figure 5:
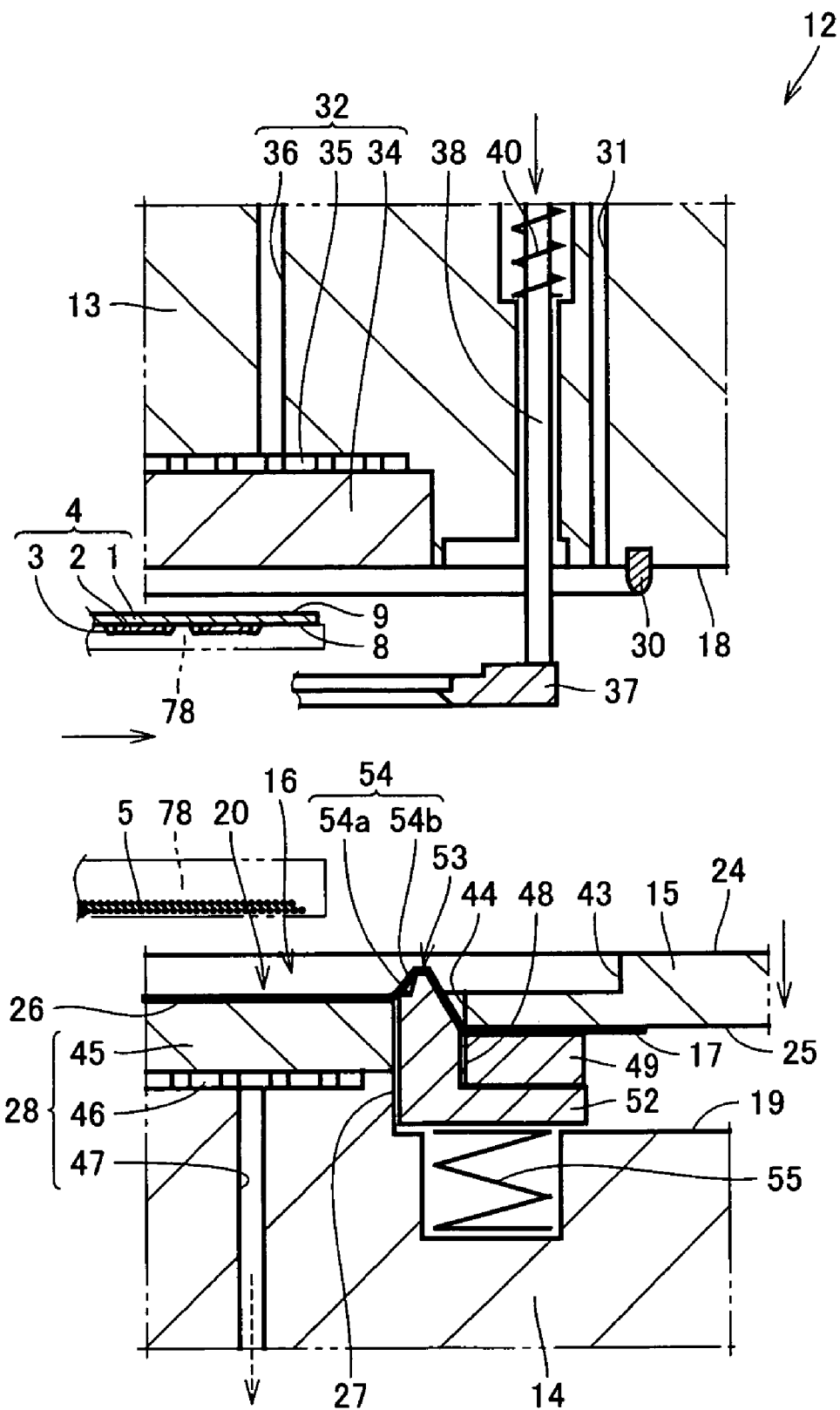
FIG. 5 is an enlarged cross-sectional view of the main portion of the mold shown in FIG. 3, in which the substrate shown in FIG. 1 and a resin material are supplied into the mold.

As shown in FIG. 5, the vertical portion of cavity member 52 has an abutting region 53 abutting on substrate rim portion 8 of substrate 1 with release film 17 interposed therebetween, a cavity bottom surface 54a arranged around cavity surface 26 and forming a portion of a bottom surface of cavity 16, and a cavity side surface 54b forming a side surface of cavity 16.

In addition, the horizontal portion of cavity member 52 has an upper surface abutting on the lower surface of sandwiching member 49 and a lower surface which abuts on lower mold surface 19 when cavity member 52 moves downward. Resilient member 55 is connected to the lower surface of the horizontal portion of cavity member 52 and inserted into a concave portion provided in lower mold 14.

Next, as middle mold 15 further moves downward with release film 17 sandwiched between middle mold 15 and sandwiching member 49, the lower surface of sandwiching member 49 abuts on the horizontal portion of cavity member 52, as shown in FIG. 5. In this situation, the whole surface of cavity 16 is covered with release film 17. In addition, release film 17 is adhered to cavity surface 26 by suction of film mechanism 28. With this, cavity space 20 shown in FIG. 5 is formed in cavity 16.

In the first embodiment, an integrated transfer means 78 has a cross section of a horizontally oriented U shape, and only tip portions of horizontal portions of the horizontally oriented U shape are shown in FIG. 5. In addition, unsealed substrate 4 is fixed on an upper portion of transfer means 78, and resin material 5 is fixed on a lower portion of transfer means 78.

When cavity space 20 is to be formed, middle mold 15 moves downward with release film 17 sandwiched between middle mold 15 and sandwiching member 49 until the upper surface of sandwiching member 49 reaches a position lower than abutting region 53 of cavity member 52.

In addition, when film mechanism 28 forcedly attracts release film 17 downward, release film 17 tightly adheres to the whole surface of cavity 16, that is, to all of cavity surface 26, cavity bottom surface 54a and cavity side surface 54b. Therefore, since cavity side surface 54b is covered with release film 17 without being exposed, melting resin 6 does not directly contact cavity side surface 54b when melting resin 6 is introduced into cavity 16. That is, melting resin 6 does not have a portion contacting lower mold 14. In other words, melting resin 6 enveloping chip 2 only contacts release film 17 and unsealed substrate 4. Therefore, releasability of cured resin 10 from cavity side surface 54b is increased when sealed substrate 11 is removed from lower mold 14 and middle mold 15. As a result, generation of a chip or a crack of cured resin 10 near cavity side surface 54b is prevented.

In upper mold 13, on the other hand, chuck member 37 and attached rod 38 move upward and downward when substrate 1 is sandwiched between chuck member 37 and upper mold surface 18. Chuck member 37 and attached rod 38 are driven by driving member 39 and resilient member 40.

In an operation of holder portion 33, resilient member 40 wound around attached rod 38 is first set to a contracting state. In this situation, as shown in FIG. 5, chuck member 37 is separated from upper mold surface 18. In this state, unsealed substrate 4 is supplied between chuck member 37 and upper mold surface 18 by transfer means 78. Resin material 5 is also transferred into mold 12 by transfer means 78 together with unsealed substrate 4.

Figure 6:
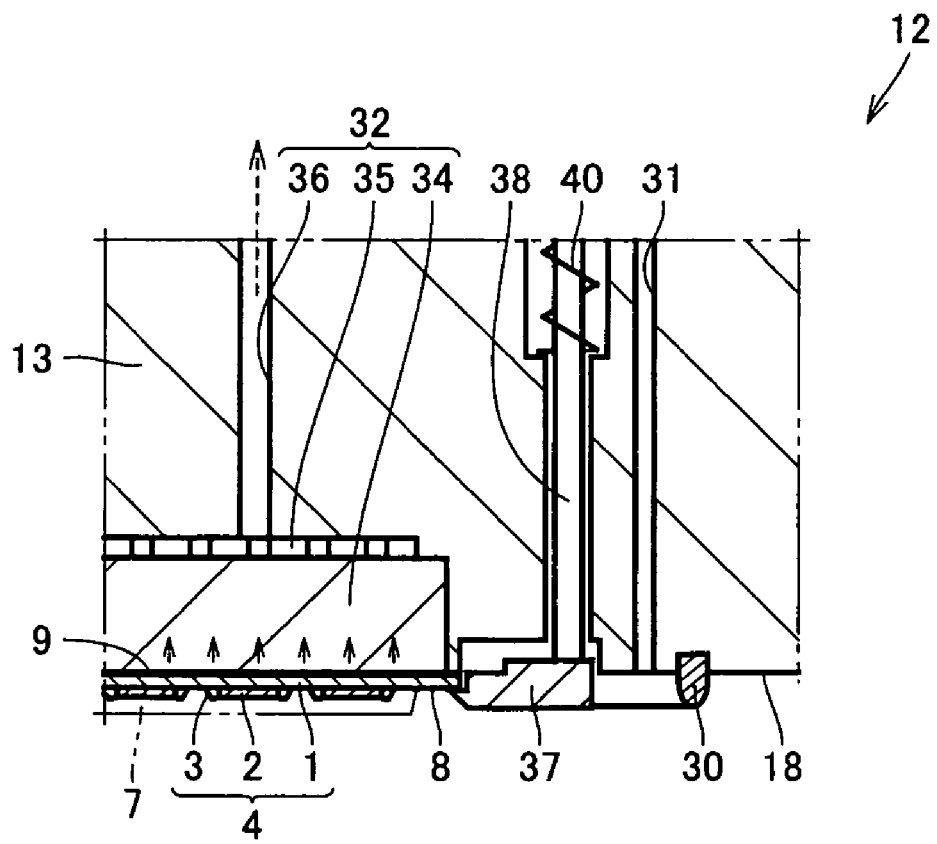
FIG. 6 is an enlarged cross-sectional view of the main portion of the mold shown in FIG. 3, in which the substrate shown in FIG. 1 is mounted on the upper mold and the resin material melts in a cavity with application of heat.
Figure 6:
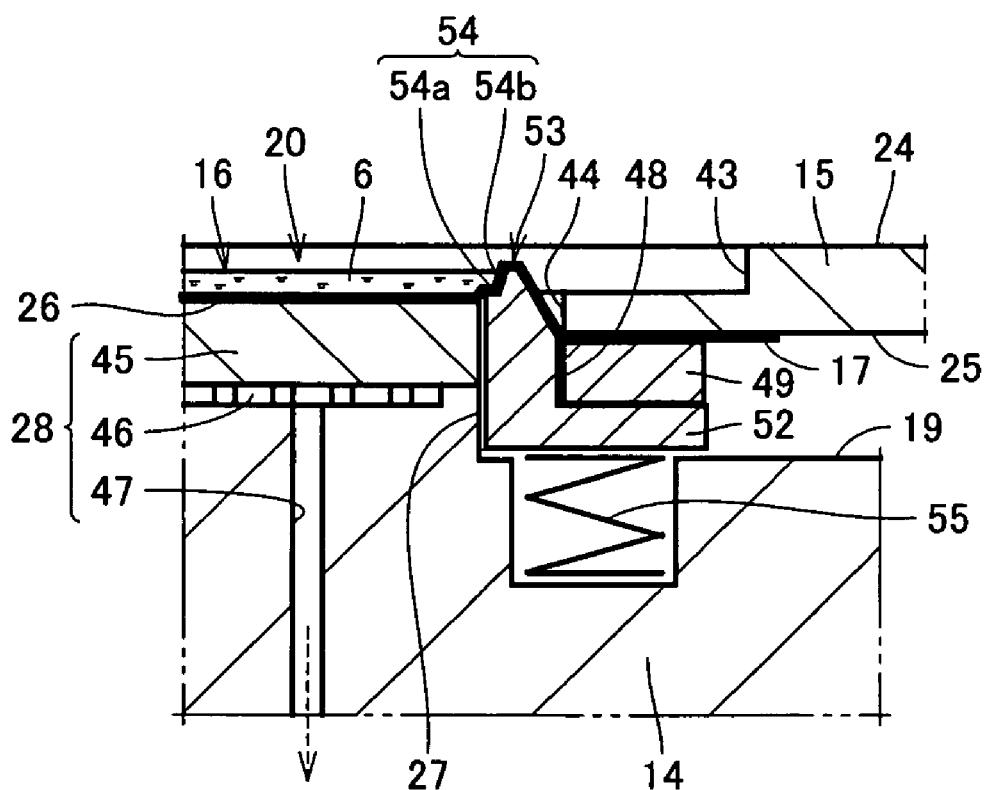

Thereafter, resin material 5 supplied into cavity space 20 is heated to become melting resin 6, as shown in FIG. 6. In this state, release film 17 covering cavity surface 26 is more reliably prevented from becoming crinkled by gravitation of melting resin 6.

Figure 7:
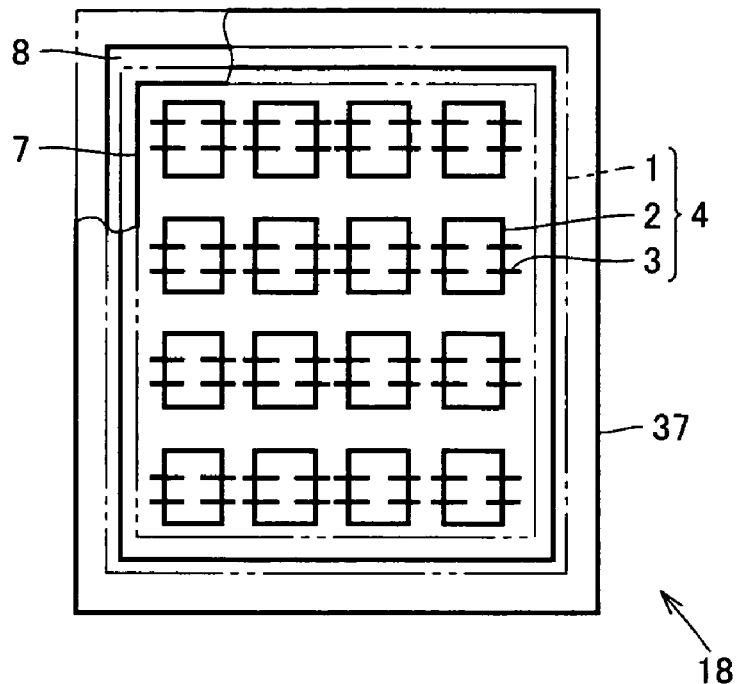
FIG. 7 shows the upper mold of the mold shown in FIG. 6 seen from a downside, in which the substrate shown in FIG. 1 is mounted on an upper mold surface.
Figure 8:
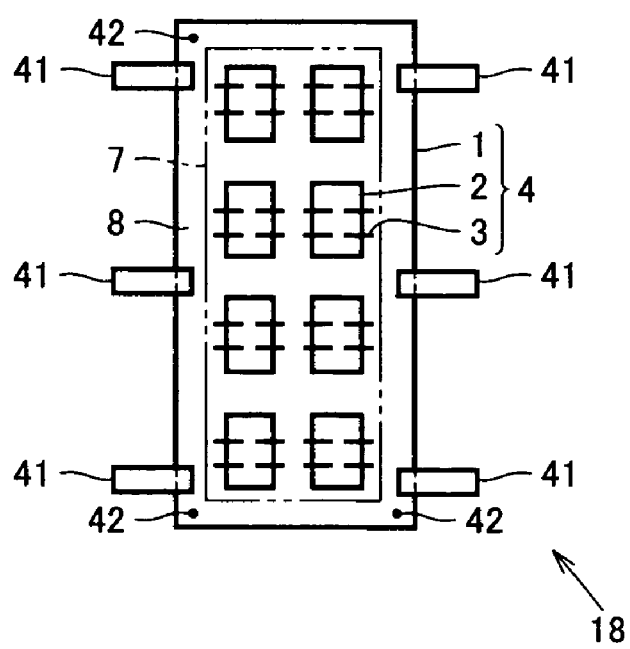
FIG. 8 shows another example of the upper mold of the mold shown in FIG. 6 seen from a downside, in which the substrate shown in FIG. 1 is mounted on an upper mold surface.

As shown in FIG. 7, holder portion 33 holds a whole of substrate rim portion 8 of substrate 1 with chuck member 37. Substrate rim portion 8, however, may be held by a chuck nail 41, as shown in FIG. 8. Alternatively, substrate 1 may be fixed to upper mold 13 by a locating hole 42 provided in substrate rim portion 8 and a locating pin inserted into the locating hole.

Figure 9:
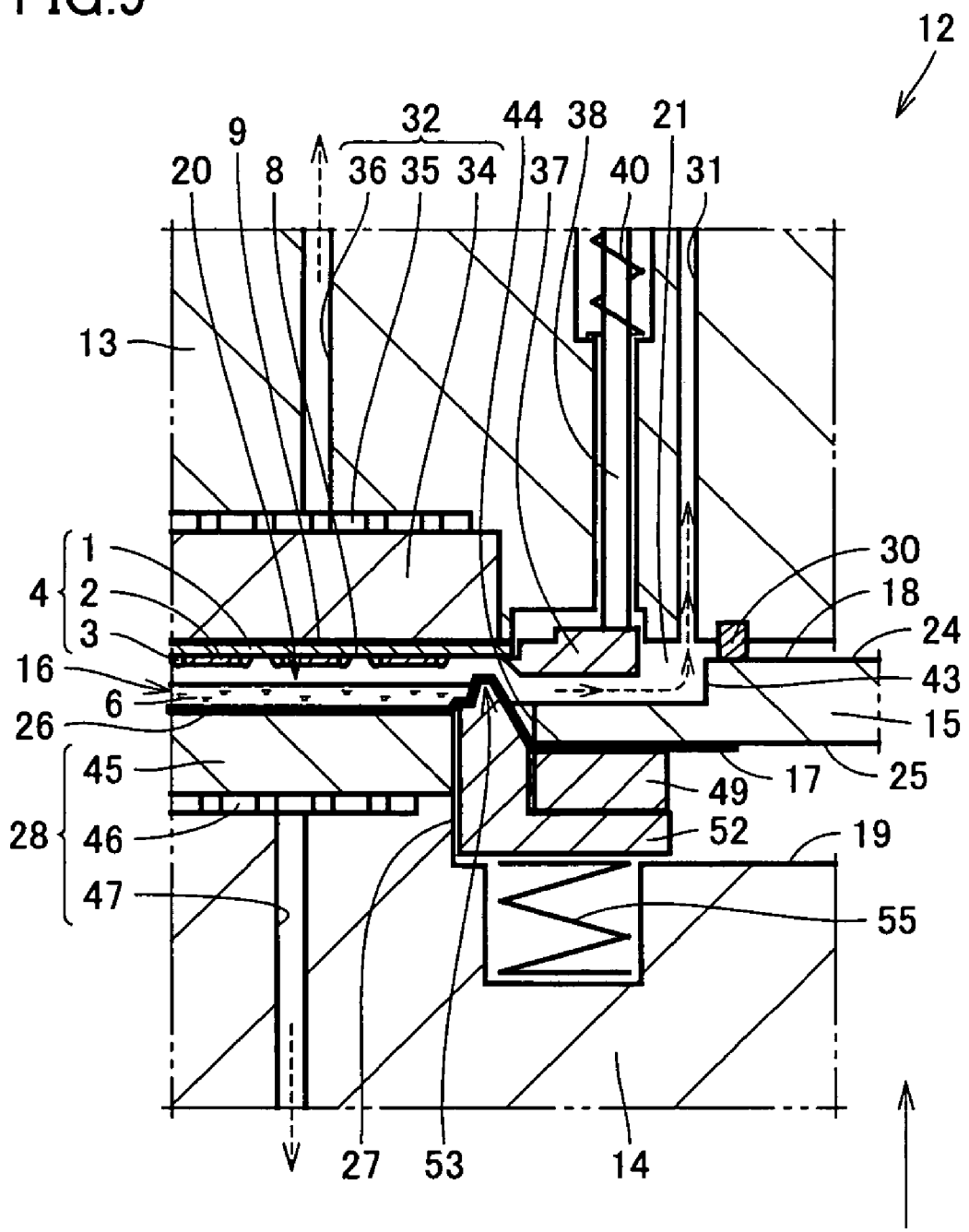
FIG. 9 is an enlarged cross-sectional view of the main portion of the mold shown in FIG. 3, in which air inside the mold is evacuated and the mold is set to a vacuum state.
Figure 10:
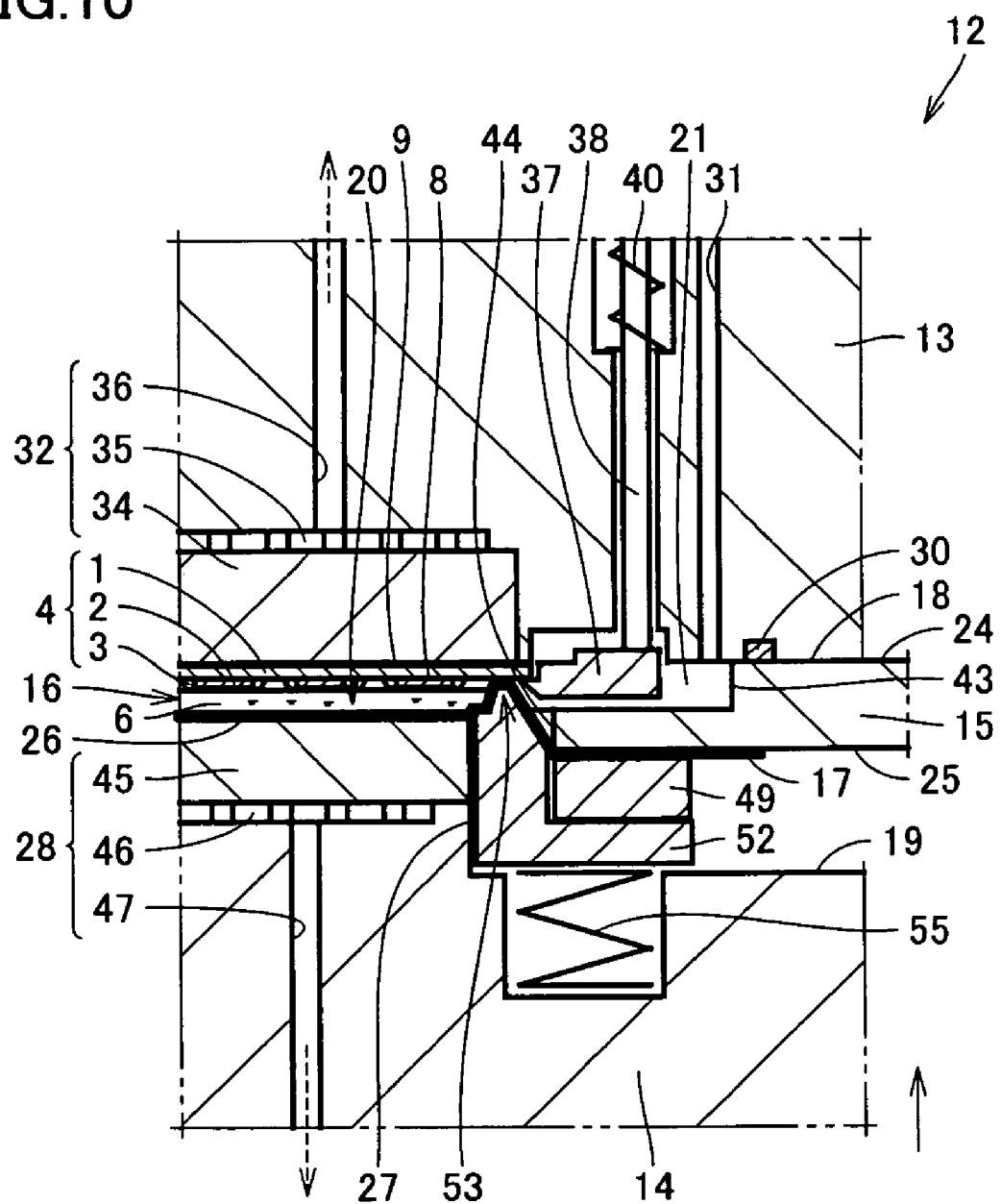
FIG. 10 is an enlarged cross-sectional view of the main portion of the mold shown in FIG. 3, in which the substrate shown in FIG. 1 is to be immersed in a melting resin.

Next, upper mold-side mold surface 24 abuts on seal member 30, as shown in FIG. 9. Thereafter, the vacuum mechanism evacuates air inside an internal air isolation space 21 via suction and exhaust hole 31 communicating with internal air isolation space 21 while seal member 30 is compressed. In this situation, abutting region 53 is inserted into through hole 44 and abuts on substrate rim portion 8 with release film 17 interposed therebetween, as shown in FIG. 10.

Figure 11:
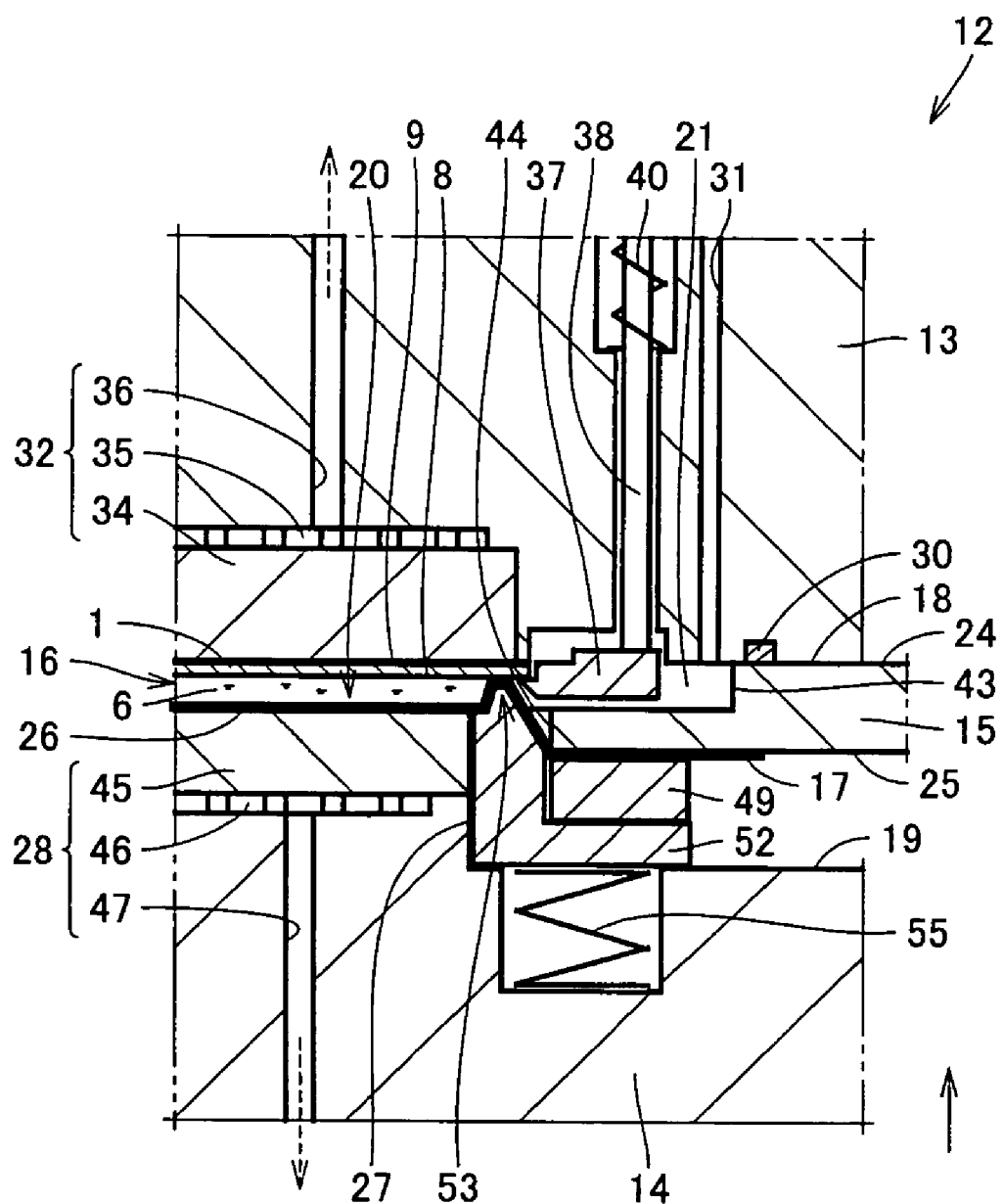
FIG. 11 is an enlarged cross-sectional view of the main portion of the mold shown in FIG. 3, in which the mold is completely clamped and the substrate shown in FIG. 1 is entirely immersed in the melting resin.

With this, chip 2 is immersed in melting resin 6 in cavity space 20 together with wire 3. In this situation, abutting region 53 abuts on a whole of substrate rim portion 8. Therefore, melting resin 6 does not leak onto substrate rim portion 8 in a state shown in FIG. 10. Then, as shown in FIG. 11, resin sealing of chip 2 is completed. After a lapse of a prescribed time, melting resin 6 of a portion near chip 2 is cured and cured resin 10 is molded.

Figure 12:
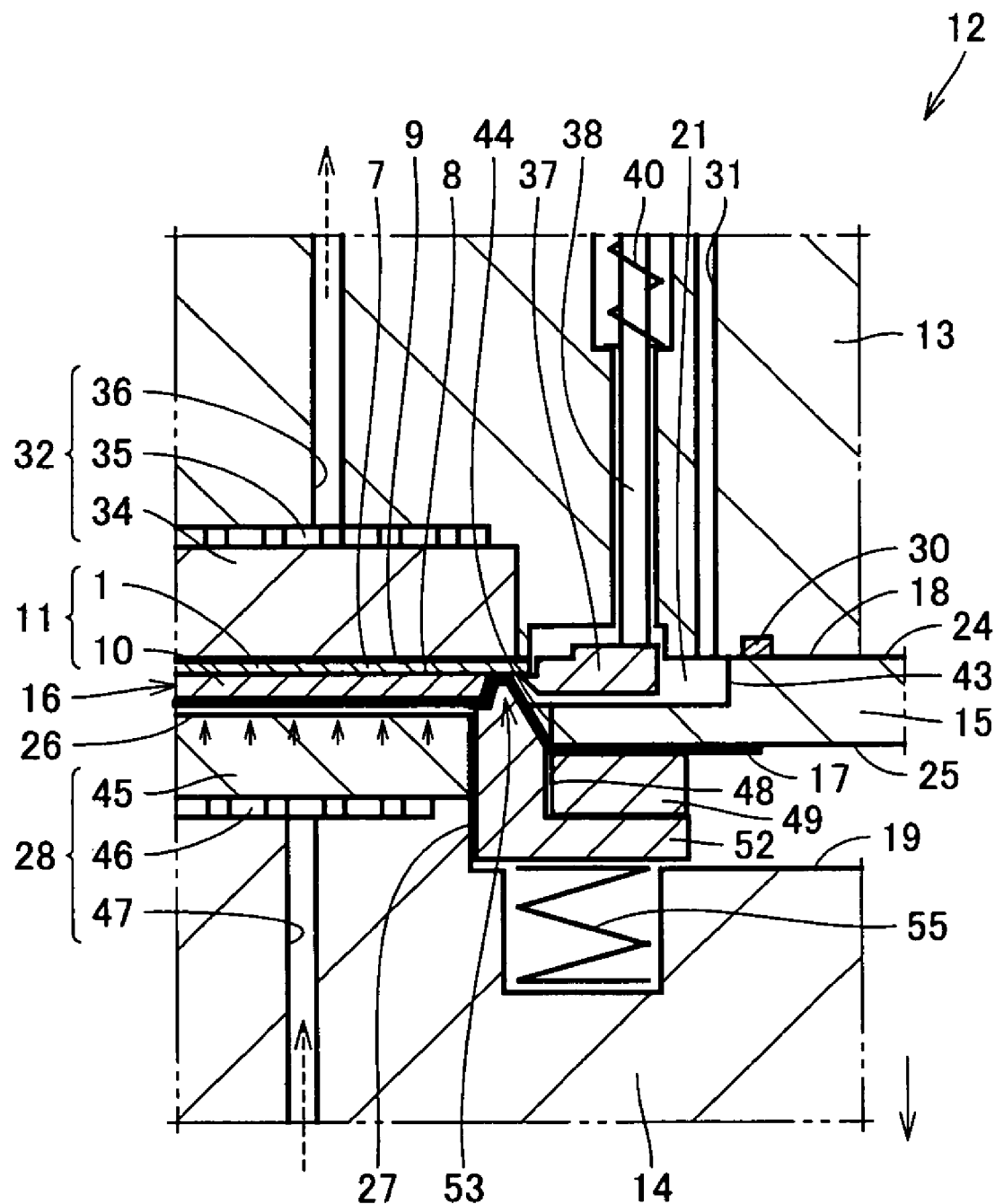
FIG. 12 is an enlarged cross-sectional view of the main portion of the mold shown in FIG. 3, in which the substrate after resin sealing has just been released from the lower mold.

Then, when lower mold 14 moves downward to remove sealed substrate 11 from lower mold 14 and release film 17, a clearance is formed between release film 17 contacting cured resin 10 and cavity surface 26, as shown in FIG. 12. In this situation, sealed substrate 11 is completely removed from release film 17 (cavity surface 26) by attracting release film 17 utilizing a function of film mechanism 28.

Then, though not shown in the drawing, lower mold 14 and middle mold 15 move downward while sealed substrate 11 is separated from cavity surface 26. In this state, sealed substrate 11 is still mounted on upper mold surface 18.

Figure 13:
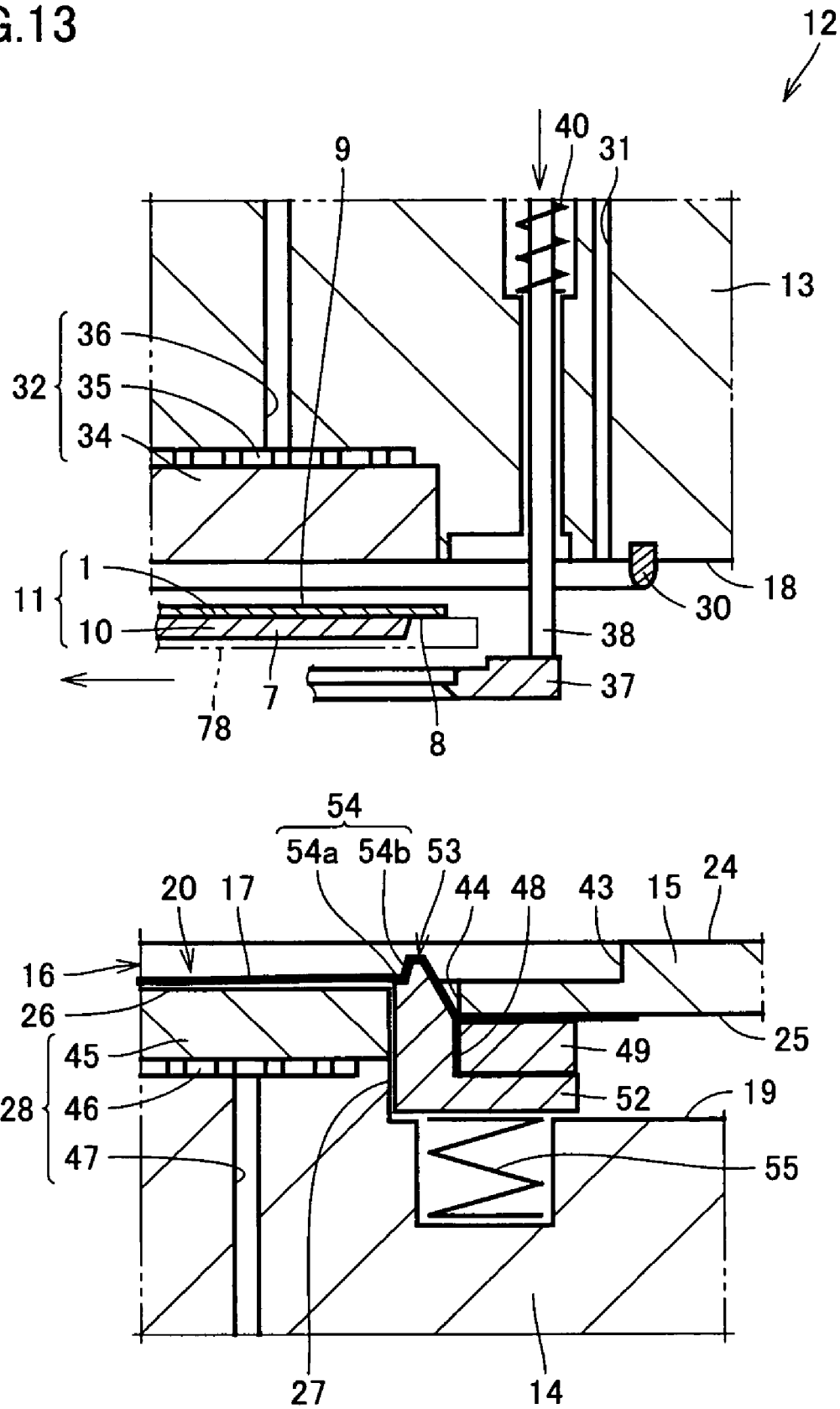
FIG. 13 is an enlarged cross-sectional view of the main portion of the mold shown in FIG. 3, in which the substrate shown in FIG. 1 has just been removed from the upper mold.

Thereafter, upper mold 13 and lower and middle molds 14, 15 are opened. Then, chuck member 37 is separated from upper mold surface 18 to remove sealed substrate 11 from upper mold 13. In this state, transfer means 78 removes sealed substrate 11 from upper mold 13, as shown in FIG. 13.

Second Embodiment

A method of resin sealing of an electronic component according to a second embodiment of the present invention and a: mold used in the method will now be described referring to FIGS. 14-16.

It is to be noted that, portions of the mold for resin sealing in this embodiment indicated with the same reference characters as those of mold 12 for resin sealing in the first embodiment have the same structures and functions as those indicated with the same reference characters in the first embodiment, and therefore descriptions thereof will not be repeated. Therefore, in this embodiment, differences from the method of resin sealing of an electronic component of the first embodiment and from the mold used in the method will be mainly described.

Figure 14:
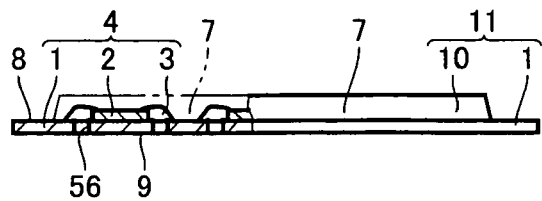
FIG. 14 shows a substrate having a semiconductor chip for resin sealing mounted thereon according to a second embodiment. The substrate before resin sealing is shown on a left side and the substrate after resin sealing is shown on a right side.

As shown in FIG. 14, substrate 1 of the second embodiment has a through hole 56 formed between a region in which wire 3 is connected to substrate 1 and a region in which chip 2 contacts substrate 1. During resin sealing, a release film 57 described below is used to prevent the melting resin filling through hole 56 from leaking onto non-mounting surface 9.

Though not shown in FIG. 2, a film unit 72 in this embodiment has a mechanism to transfer release film 57 independently of a transfer mechanism of release film 17, as described below.

Figure 15:
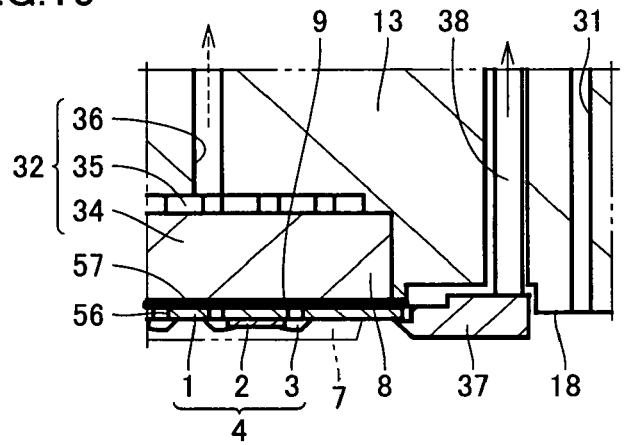
FIG. 15 is an enlarged cross-sectional view of a mold according to the second embodiment, in which the substrate shown in FIG. 14 is mounted on an upper mold surface.
Figure 16:
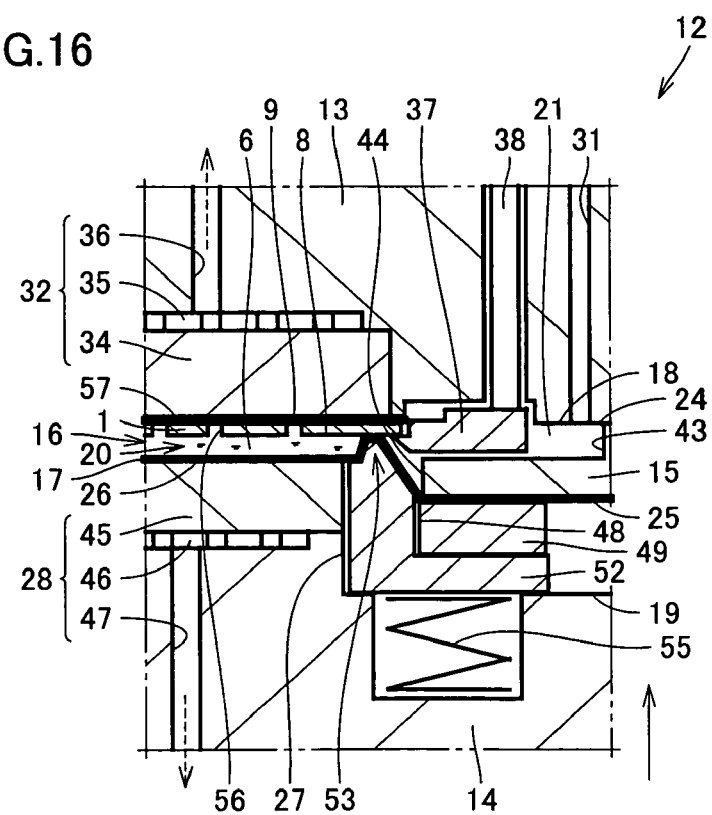
FIG. 16 is an enlarged cross-sectional view of a main portion of the mold according to the second embodiment, in which the mold is completely clamped and the substrate shown in FIG. 14 is entirely immersed in a melting resin.

In the method of resin sealing of an electronic component of this embodiment, release film 57 is supplied between non-mounting surface 9 of substrate 1 and upper mold surface 18 of upper mold 13 to cover upper mold surface 18, as shown in FIGS. 15 and 16. Similarly as release film 17, release film 57 moves in a direction perpendicular to a paper surface of each of FIGS. 15 and 16. In addition, a weak adhesion layer may be provided on a surface of release film 57 contacting non-mounting surface 9 to avoid a clearance formed between non-mounting surface 9 and release film 57. In this situation, the weak adhesion layer must not remain on non-mounting surface 9 when sealed substrate 11 is removed from upper mold 13. When release film 57 covers non-mounting surface 9, resin sealing may be performed with release film 57 entering through hole 56.

In this embodiment, substrate 1 is similarly provided between upper mold 13 and middle mold 15 with a surface having chip 2 mounted thereon facing downward, as shown in FIG. 15. Thereafter, release film 57 is adhered to upper mold surface 18 by suction. Then, non-mounting surface 9 of substrate 1 is mounted on upper mold surface 18 with release film 57 interposed therebetween.

As shown in FIG. 16, melting resin 6 then fills a portion near chip 2 as well as through hole 56, and melting resin 6 is cured to complete resin sealing. In this situation, melting resin 6 is prevented from leaking onto non-mounting surface 9 by release film 57.

Suction portion 32 is desirably switched from a state of evacuating air to a state of discharging air just before clamping of the three molds. With this, release film 57 is pressed against non-mounting surface 9 of substrate 1 by air discharged from permeable member 34. As a result, adhesion of release film 57 to non-mounting surface 9 of substrate 1 is further enhanced, and a possibility of the resin flowing onto non-mounting surface 9 is decreased more reliably.

With the method of resin sealing of an electronic component of this embodiment as described above, releasability of sealed substrate 11 from cavity 16 is also increased and, therefore, generation of a chip or a crack of cured resin 10 is prevented.

Third Embodiment

A method of resin sealing of an electronic component according to a third embodiment of the present invention and a mold used in the method will now be described referring to FIGS. 17-19.

It is to be noted that, portions of the mold for resin sealing in this embodiment indicated with the same reference characters as those of mold 12 for resin sealing in each of the first and second embodiments have the same structures and functions as those indicated with the same reference characters in each of the first and second embodiments, and therefore descriptions thereof will not be repeated. Therefore, in this embodiment, differences from the method of resin sealing of an electronic component of each of the first and second embodiments and from the mold used in the method will be mainly described.

Figure 17:
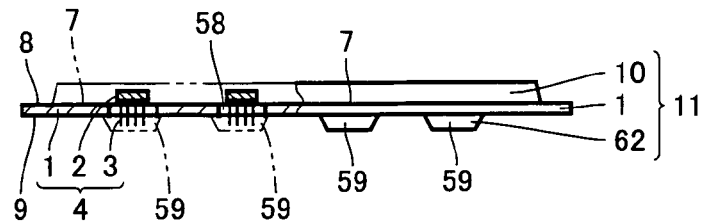
FIG. 17 shows a substrate having a semiconductor chip for resin sealing mounted thereon according to a third embodiment. The substrate before resin sealing is shown on a left side and the substrate after resin sealing is shown on a right side.

As shown in FIG. 17, unsealed substrate 4 used in this embodiment has a plurality of chips 2 provided on one surface thereof and wire 3 connected to each chip 2 and protruding from the other surface. Unsealed substrate 4 of this embodiment has a through hole 58 formed near a position in which substrate 1 contacts chip 2.

In addition, sealed substrate 11 has sealing and molding portion 7 on which cured resin 10 enveloping chip 2 is formed, a sealing and molding portion 59 for enveloping wire 3 alone, substrate rim portion 8 on which a resin is not molded, and non-mounting surface 9 on which chip 2 is not mounted. Furthermore, in the method of resin sealing of this embodiment, a resin flows from sealing and molding portion 7 on one surface to sealing and molding portion 59 on the other surface via through hole 58, as shown in FIG. 19. After resin sealing, sealed substrate 11 is obtained which has cured resin 10 formed on one surface thereof and a cured resin 62 formed on the other surface.

Upper mold 13 of the third embodiment further includes an upper mold cavity 60 provided in permeable member 34 for housing wire 3 extending from the other surface of substrate 1. This is a difference of mold 12 of this embodiment from mold 12 of each of the first and second embodiments. As shown in FIG. 18, a cavity formation member 61 having a concave portion corresponding to a position, a size and a shape of wire 3 is inserted in upper mold cavity 60.

Cavity formation member 61, however, may not be provided and a concave portion for housing wire 3 may be formed in permeable member 34. In addition, permeable member 34 may not be provided and upper mold cavity 60 may be provided in upper mold surface 18. Furthermore, release film 57 described in the second embodiment may be supplied between non-mounting surface 9 of substrate 1 and upper mold surface 18 to avoid flowing of melting resin 6 into a portion between upper mold cavity 60 and non-mounting surface 9 of substrate 1.

Figure 18:
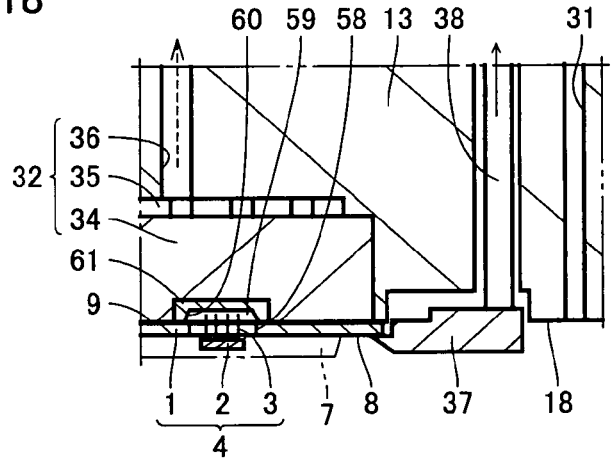
FIG. 18 is an enlarged cross-sectional view of a mold according to the third embodiment, in which the substrate shown in FIG. 17 is mounted on an upper mold surface.
Figure 19:
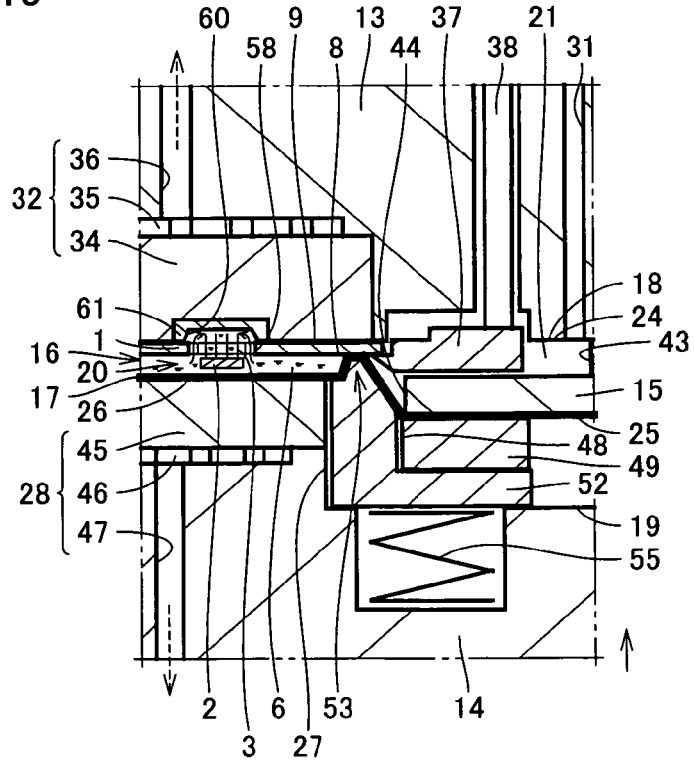
FIG. 19 is an enlarged cross-sectional view of a main portion of the mold according to the third embodiment, in which the mold is completely clamped and the substrate shown in FIG. 17 is entirely immersed in a melting resin.

In the method of resin sealing of an electronic component of this embodiment, a substrate 1 is first supplied between upper mold 13 and middle mold 15, as shown in FIG. 18. Then, melting resin 6 is supplied into cavity space 20, as shown in FIG. 19. Thereafter, lower mold 14 and middle mold 15 move toward upper mold 13 until substrate rim portion 8 abuts on abutting region 53 of cavity member 52. With this, melting resin 6 flows from sealing and molding portion 7 on one surface to sealing and molding portion 59 on the other surface via through hole 58. A projection (not shown) may be provided on a surface of cavity formation member 61 to avoid flowing of melting resin 6 into a portion around cavity formation member 61 in this situation.

With the method of resin sealing of an electronic component of this embodiment, releasability of sealed substrate 11 from cavity 16 is also increased and, therefore, generation of a chip or a crack of cured resin 10 is prevented.

Though the method of resin sealing of an electronic component of each embodiment described above is used for resin sealing of chip 2 subject to wire bonding, the method can also be applied to resin sealing of a flip chip substrate having chip 2 mounted thereon without wire 3, or to resin sealing of a wafer level package. In this situation, a melting resin may be produced using a tablet-shaped resin material 5.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A method of resin sealing of an electronic component in a cavity using an upper mold, a lower mold opposite to said upper mold, a middle mold provided between said upper mold and said lower mold and including a through hole into which said lower mold can be inserted, and a release film covering the cavity of said lower mold; said method comprising the steps of:

attaching to said upper mold an unsealed substrate having said electronic component mounted thereon;

inserting said lower mold into said through hole of said middle mold, while said release film is held between said lower mold and said middle mold;

covering a whole surface of said cavity with said release film while said release film is sandwiched between said lower mold and said middle mold;

clamping said upper mold together with said lower mold and said middle mold to immerse said electronic component in a melting resin in said cavity;

curing said melting resin to form a cured resin;

opening said upper mold, said lower mold and said middle mold; and removing a sealed substrate having said electronic component enveloped in said cured resin from said upper mold.

* * * * *

UNITED STATES PATENT AND TRADEMARK OFFICE
CERTIFICATE OF CORRECTION

PATENT NO. : 7,618,573 B2
APPLICATION NO. : 10/562356
DATED : November 17, 2009
INVENTOR(S) : Takase et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 915 days.

Signed and Sealed this

Twenty-sixth Day of October, 2010

David J. Kappos
*Director of the United States Patent and Trademark Office*